United States Patent [19]

Smith et al.

[11] Patent Number: 5,332,697
[45] Date of Patent: Jul. 26, 1994

[54] FORMATION OF SILICON NITRIDE BY NITRIDATION OF POROUS SILICON

[76] Inventors: Rosemary L. Smith; Scott D. Collins, both of 667 Adams, #3, Davis, Calif. 95616

[21] Appl. No.: 776,991

[22] Filed: Oct. 16, 1991

Related U.S. Application Data

[62] Division of Ser. No. 359,354, May 31, 1989, abandoned.

[51] Int. Cl.$^5$ .............................................. H01L 21/02
[52] U.S. Cl. ................................... 437/242; 437/244; 423/344
[58] Field of Search ............... 423/344; 501/97, 154; 427/255; 437/241, 242, 244; 264/48, 62, 65; 148/DIG. 112, DIG. 114

[56] References Cited

U.S. PATENT DOCUMENTS

| | | | |
|---|---|---|---|
| 3,215,547 | 11/1965 | Parr et al. | 501/97 |
| 3,652,324 | 3/1972 | Chu et al. | 357/54 |
| 3,811,928 | 5/1974 | Henney et al. | 501/97 |
| 3,818,582 | 6/1974 | Kaiser | 357/23.15 |
| 3,853,496 | 12/1974 | Kim | 357/23.5 |
| 4,017,319 | 4/1977 | Greskovich et al. | 501/97 |
| 4,028,149 | 6/1977 | Deines et al. | 148/175 |
| 4,033,287 | 7/1977 | Alexander et al. | 118/725 X |
| 4,040,849 | 8/1977 | Greskovich et al. | 501/154 |
| 4,045,258 | 8/1977 | Kaiser | 357/34 |
| 4,177,230 | 12/1979 | Mazdiyasni | 501/97 |
| 4,200,666 | 4/1980 | Reinberg | 437/241 X |
| 4,277,320 | 7/1981 | Beguwala et al. | 204/164 |
| 4,298,629 | 11/1981 | Nozaki et al. | 427/39 |
| 4,346,147 | 8/1982 | Bailier et al. | 501/154 |
| 4,351,787 | 9/1982 | Martinengo et al. | 501/154 |
| 4,388,255 | 6/1983 | Simpson | 501/154 |
| 4,429,003 | 1/1984 | Frediksson et al. | 428/408 |
| 4,435,447 | 3/1984 | Ito et al. | 427/94 |
| 4,579,699 | 4/1986 | Verzemnieks | 501/154 |
| 4,596,716 | 6/1986 | DeMunda et al. | 427/243 |
| 4,627,883 | 12/1986 | Holmstrom et al. | 148/87 |
| 4,629,707 | 12/1986 | Wolfe | 501/97 |
| 4,665,426 | 5/1987 | Allen et al. | 357/54 |
| 4,717,602 | 1/1988 | Yamazaki | 427/53.1 |
| 4,808,558 | 2/1989 | Park et al. | 501/154 |
| 4,995,954 | 2/1991 | Guilinger et al. | 204/129.75 |
| 5,023,200 | 6/1991 | Blewer et al. | 437/187 |
| 5,032,545 | 7/1991 | Doan et al. | 437/242 |
| 5,111,221 | 5/1992 | Fare et al. | 437/228 |

OTHER PUBLICATIONS

Tsao et al., "Porous Silicon Oxynitrides formed by Ammonia Heat Treatment", Journal of Applied Physics, vol. 67, No. 8, (Apr. 15, 1990) pp. 3842-3847.
"Silicon Nitride" from Chapter 8: Films for protection and masking in *VLSI Fabrication Principles*, by S. K. Ghandi, (J. Wiley & Sons, 1983), pp. 427-429.
"Properties and chemical vapor deposition of silicon nitride", from Chapter 6: Chemical vapor deposition of amorphous and polycrystalline films, in *Silicon Processing for the VLSI Era*, by S. Wolf and R. N. Tauber (Lattice Press, 1986), pp. 161-175; 191-194.
Blewer, et al., Abstract, "Buried Layer Tungsten Deposits in Porous Silicon: Metal Penetration Depth and Film Purity Determinants", Doe No. DE-Ac0-4-76DP00789 (date unknown).
Bomchil, et al., MRS-Europe, pp. 463-374 (1985).
V. Demarne, et al., *Transducers '87* pp. 605-609 (1987).
Tabata, *IEEE Transactions on Electron Devices*, vol. ED-33, No. 3 pp. 361-365 (Mar. 1986).
Barla, et al., *Insulating Films on Semiconductors* pp. 53-56 (Elsevier Science Publishers, Holland 1986).

*Primary Examiner*—Olik Chaudhuri
*Assistant Examiner*—Ken Horton

[57] ABSTRACT

Low residual stress, stoichiometric or near stoichiometric, silicon nitride and silicon carbide films with thicknesses of one micron or greater are produced by reacting porous silicon with a nitrogen or carbon containing gas, such as ammonia or methane, at an appropriate temperature and pressure. The gas diffuses into the pores and reacts with the silicon skeletal structure. Because the initial structure is porous and the pore spaces provide strain relief during the addition reaction and subsequent volume expansion, the resultant film has relatively low residual stress. Either porous or solid films can be produced. This process provides a means to chemically stabilize porous silicon layers and their morphologies.

9 Claims, No Drawings

FORMATION OF SILICON NITRIDE BY NITRIDATION OF POROUS SILICON

This is a division of U.S. Ser. No. 07/359,354, for "Formation of Silicon Nitride by Nitridation of Porous Silicon" filed on May 31, 1989, by Rosemary L. Smith and Scott D. Collins, now abandoned.

BACKGROUND OF THE INVENTION

This relates to silicon compounds, including silicon nitride, silicon carbide and silicides, and processes for production thereof.

Silicon nitride has the useful properties of very high tensile strength, mechanical hardness, high melting point, high chemical resistance, high refractive index and good electrical insulating properties. It is commonly used as a protective coating for high performance mechanical parts and as a thin, dielectric film in microelectronic and optical components. The amorphous compound $Si_3N_4$, is most often used, of which there are many different microstructural forms, e.g. $\alpha$, $\beta$ and gamma.

Bulk silicon nitride is usually formed by sintering powdered silicon nitride at high temperatures, greater than 1000° C., and under high pressure. It can also be deposited as a thin film by sputtering from a solid target, or by chemical vapor deposition (CVD). One example of the latter is the decomposition of silane and ammonia over the surface of a heated substrate.

CVD processes allow the formation of conformal silicon nitride thin films with highly controlled composition, and low defect density. The lower the number of defects and impurities in the film, the better the dielectric properties, chemical resistance, and hardness of the material. However, CVD films have high residual stress ($2 \times 10^9$ Pa, tensile stress for $Si_3N_4$), which limits the deposition thickness to less than about one micron if microcrack formation is to be avoided. Although sputtered films have much lower residual stress and can therefore be deposited to greater thicknesses, sputtering is a slow process, most sputtering systems have a lower substrate capacity than CVD systems, and sputtered films have higher defect density and impurity concentrations than CVD films.

Thin films of very high quality silicon nitride can also be produced by direct nitridation of silicon. Silicon substrates or films are heated and reacted with ammonia and/or nitrogen. The film growth quickly becomes limited by the diffusion of reactant through the growing film. The film thickness can be increased by increasing the growth temperature, but, even at 1100° C., it is difficult to produce films thicker than about 100 Ångstroms.

Silicon nitride possesses a unique combination of properties that makes it an excellent fabrication material for micro- mechanical, electrical and optical components. Applications include situations where thick films, or plates, of silicon nitride would be desirable, for example, as a mask for x-ray lithography for integrated circuit fabrication. Substrates on which the masking, i.e. x-ray absorbent, patterns are formed, are made x-ray transparent by the appropriate combination of material and its thickness. Thin plates of silicon can be used, but silicon must be made very thin in order to transmit x-rays, and this results in very fragile masks and limited mask size. Silicon nitride is more X-ray transparent and a much stronger material. However, present methods of making silicon nitride limit its use due to high residual stress. Silicon-rich nitrides have lower residual stress, but also have lower transmittance. Accordingly, a means to form thick, i.e., greater than about five microns, films of silicon nitride with moderate tensile stress would be very useful in the future development and commercialization of x-ray lithography.

Another potential application of low stress, thick silicon nitride is as components of micromechanical systems. The growing field of micro-mechanics (the micro-motor) is creating a demand for materials which can be micro-machined and can withstand repeated strain and frictional wear. Silicon nitride is one of the hardest materials known and is more chemically stable than silicon; it is therefore an excellent material for use in such applications.

Silicon rich nitride has a much lower stress than stoichiometric nitride, which allows its use in thick films of up to about 5 microns. Unfortunately, silicon rich nitride also has less chemical resistance, hardness and optical transparency.

The advantages of stoichiometric nitride over the silicon rich nitrides currently used in these and other designs, include a higher chemical resistance and better electrical isolating properties. The present technologies for forming silicon nitride films of 3:4 stoichiometry result in films of very high residual stress, limiting their thicknesses to less than about 1 micron. Thick films of silicon nitride, of nearly stoichiometric composition, which could be formed on a silicon substrate, have several immediate, and potential, applications. One is the formation of silicon nitride membranes, diaphragms and plates on silicon wafers. Membranes and diaphragms have potential applications as micromechanical components, for example as the pressure deformable component of a micro pressure transducer. Another potential application is an optical window for integrated optics and memory chips. Further, silicon nitride could be used as a thermally insulating membrane in microsensor configurations which employ heaters, such as semiconductor gas sensors which rely on thermal desorption characteristics of gases for selectivity, or in flow sensors which rely on the thermal conductivity of gases, etc.

The choice of a fabrication material is determined not only by its performance in the intended role, but also by consideration of the ease by which it can be manufactured. Silicon nitride has the added advantage of high chemical resistance, which makes it an excellent etch-mask for silicon anisotropic etchants. It can also be used as an etch stop layer. Since it is resistant to corrosion, and an excellent barrier to the diffusion of ions and water, integrated circuit manufacturers have taken advantage of these properties and use silicon nitride as a final encapsulating layer. It has also been extensively used as a solid state encapsulant for chemical microsensors.

Chemical resistance is particularly useful in the fabrication of nitride membranes, because it facilitates the selective removal of the silicon substrate, or intermediate layers, from the nitride. Also, silicon nitride is often used as an etch stop layer in the surface micromachining processes which are used to release thin film micromechanical parts from the substrate onto which they have been deposited. Nitride is particularly useful when the spacer or sacrificial layer between the thin film mechanical parts and the substrate is silicon oxide. This is because the etchant used for release, i.e. to remove the oxide, contains hydrofluoric acid, which etches stoichiometric nitride at a rate somewhat less than 1/100 the rate it etches oxide. The long etch times for releasing parts results in a need for very thick nitride stop layers. Currently, these layers are limited to less than a micron, and hence the etch time, and the geometries of structures that can be released, are also limited.

Additional microfabrication and device applications also exist with respect to other silicon compounds, such as silicon carbide, and silicides such as TiSi and WSi. In contrast to silicon nitride and silicon carbide, silicides are conductors and therefore have applications distinct from those utilizing the insulating properties of the silicon nitride and silicon carbide.

It is therefore an object of the present invention to provide low stress, low or defect free, silicon nitride films of uniform thickness of greater than about one micron.

It is a further object of the present invention to provide a method of stabilizing porous silicon morphologies with a silicon nitride layer.

It is a further object of the present invention to provide porous silicon nitride layers.

It is another object of the invention to provide porous silicon carbide and silicide layers.

SUMMARY OF THE INVENTION

Low residual stress, stoichiometric or near stoichiometric silicon nitride and silicon carbide films with thicknesses of one micron or greater are produced by reacting porous silicon with a nitrogen or carbon containing gas, such as ammonia or methane, respectively, at an appropriate temperature and pressure. The gas diffuses into the pores and reacts with the silicon skeletal structure. Because the initial structure is porous and the pore spaces provide strain relief during the addition reaction and subsequent volume expansion, the resultant film has relatively low residual stress. This process provides a means to chemically stabilize porous silicon layers and their morphologies, and to form thick layers of silicon compounds.

The general reaction is summarized as $$Si_{(porous\ solid)} + XY_{(gas)} \rightarrow Si_iX_{j(porous\ solid)} + Y_{(gas)}$$

wherein XY is a nitrogen containing gas such as NH$_3$, or a carbon containing gas such as CH$_4$, and Si$_i$X$_j$ is the addition reaction product, for example, either Si$_3$N$_4$ or SiC.

The porous silicon nitride and silicon carbide have a number of applications, including use in x-ray mask fabrication, for the formation of silicon nitride membranes, diaphragms and plates on silicon wafers, as a limited diffusion barrier to ions, for example, in a miniature reference electrode, as a gas diffusion barrier in gas sensors operated in the diffusion limited regime, and in a humidity sensor, among others.

DETAILED DESCRIPTION OF THE INVENTION

The method of the present invention uses the addition reaction of porous silicon with a reactive compound containing either nitrogen or carbon, such as ammonia or methane gas, to either partially or completely convert the porous structure to silicon nitride or silicon carbide. The porous silicon is reacted with the gas to yield thicknesses in excess of those obtainable using displacement or deposition reactions.

In contrast, in deposition reactions, such as the CVD processes commonly used in integrated circuit processing, the silicon substrate is not directly affected. For example, in the case of silicon nitride, $$SiH_{4(gas)} + NH_{3(gas)} \rightarrow Si_3N_{4(solid)} + H_{2(gas)}$$

or $$SiH_2Cl_{2(gas)} + NH_{3(gas)} \rightarrow Si_3N_{4(solid)} + H_{2(gas)} + Cl_{2(gas)}$$

In comparison, in displacement reactions, the solid, for example, the silicon, is displaced by an element in a gas, as in:

$$Si_{(solid)} + XY_{(gas)} \rightarrow X_{(solid)} + SiY_{(gas)}$$

In a specific example XY represents WF$_6$ and X represents solid tungsten W.

Two different reaction systems can be used to convert porous silicon to silicon nitride, with modifications in the morphology, material properties, density, porosity, and film thickness of the final product resulting from varying the pore size and thickness of the starting silicon, time, temperature, pressure:

$$3Si + 4NH_3 \rightarrow Si_3N_4 + 6H_2$$

$$3Si + 2N_2 \rightarrow Si_3N_4$$

Both deposition and displacement reactions can be used in addition to the method of the present invention, for example, once the nitridation, or carbidation, has been completed, to seal the surfaces of the pores or to coat the interior surface of the pores without changing the electronic or material properties of the underlying walls of the silicon, or simultaneously with the nitridation or carbidation reaction to enhance the conversion of the pores to solid material. Material can also be deposited in the pores after nitridation or carbidation has been completed using conventional plating processes, such as electroplating or electroless plating from a liquid phase. Examples of compounds that can be applied as layers to the silicon nitride or silicon carbide of the present invention are silicon, silicon rich nitride, silicon oxide, silicon dioxide, aluminum oxide, titanium silicide, tungsten silicide, copper, aluminum, gold, silver, diamond, and combinations thereof.

Porous silicon is monocrystalline silicon which contains a very high density of micro-pores or channels. The preferred method for preparing porous silicon is by anodization in hydrofluoric acid (HF). Preparation of porous silicon is described in G. Bomchil, R. Herino and K. Barla, "Formation and Oxidation of Porous Silicon for Silicon on Insulator Technologies," pp. 463-474 (1986) and K. Barla, J. J. Yon, R. Herino and G. Bomchil "Oxide Formation from Porous Silicon Layers on p-Substrates" *Insulating Films on Semiconductors* J. J. Simone and J. Buxo, eds. (Elsevier Science Publ. Holland 1986), incorporated herein by reference. The pore diameter, and the spacing between the pores, varies with doping of the silicon, HF concentration, and formation current densities. Films as thick as 200 microns of homogeneous morphology have been formed by anodically etching. One readily obtained morphology is a very tortuous porous structure, where pores branch and intersect one another at a frequency on the order of the pore diameter, in general between 10 and 100 Angstroms.

Porous silicon can be formed by other methods. For example, powdered silicon can be compressed in an inert ambient similar to the process for forming bulk porous silicon nitride or carbide. Porous silicon layers can also be formed on, or in, a silicon substrate using isotropic etching with nitric acid/acetic acid/HF.

This structure is very reactive due to the enormous exposed surface area. If left in air for more than a few days, even at room temperature, the skeletal silicon will oxidize, resulting in a porous, or even solid film, of silicon dioxide. This property has been used to produce thick silicon dioxide films at temperatures below 800° C., for electrical isolation in several integrated circuit technologies, e.g. silicon on insulator (SOI) and trench isolated circuits. Because of the tendency to oxidize, reaction conditions for nitridation or carbidation of the silicon should exclude oxygen.

The silicon can be doped with a number of different atoms, such as P, As, or B, to alter the electronic properties, using methods known to those skilled in the art. The dopants are usually diffused into the silicon at high temperatures, about 1000° C. They can also be implanted by acceleration of the atoms to high velocities and bombarding them into the silicon.

The process of the present invention is possible since the silicon wall thicknesses can be much less than twice the typical, diffusion limited nitride growth thicknesses (100 Angstroms). In applications where the porous microstructure itself is of functional interest, the porosity can be maintained and the morphology stabilized as desired. The reaction temperature and pressure can be varied, in conjunction with the porous silicon morphology, to produce either porous or solid silicon nitride or carbide films, of thickness determined by the previously formed, porous silicon layer thickness. Since the initial structure is porous, the resultant film, whether porous or not, has relatively low residual stress, due to strain relief in the third dimension, i.e. into the pore space. Due to a difference in the molar (or atomic) densities of Si and $Si_3N_4$, nitridation results in volume expansion. Pore size of the porous silicon morphology can be selected to yield a final product having open or closed pores.

The reactant in the preferred process is a gas, such as $N_2$ or $NH_3$ or $CH_4$. However, the reactant can be provided in a liquid or liquid vapor, depending on the chemical nature of the reactant and the pore size and thickness of the porous silicon. However, few reactants are liquid at the temperature of the reaction process, approximately 600° C. or greater for silicon nitride.

EXAMPLE OF THE FORMATION OF SILICON NITRIDE FROM POROUS SILICON.

Porous silicon layers of from 5 to 20 microns in thickness were converted to nitride using $NH_3$ at a flow rate of 1 L/min, 0.1 atm. pressure for 1 hr at 725° C.

A three inch silicon wafer of approximately 500 microns thickness was reacted with $NH_3$ as described above to form a 5 to 20 micron layer of silicon nitride. No measurable warpage of the wafer was apparent, indicating low residual stress. This was contrasted with tensile stresses on the order of two gigapascals for nitride films of 50 nm to 500 nm produced by CVD, which was determined by measuring the wafer curvature.

The process of the present invention produces silicon nitride having stoichiometric or near stoichiometric composition, i.e., 3:4 Si:N content, which is preferred for applications requiring high chemical resistivity, high dielectric strength, high refractive index and high fracture toughness. As discussed in the Background of the Invention, this material has application in forming silicon nitride membranes, diaphragms and plates on silicon wafers which are useful as micromechanical components, such as the pressure deformable component of a micro pressure transducer, or an optical window for integrated optics. As also discussed, stoichiometric nitride has other advantages, including higher chemical resistance and better electrical insulating properties. Chemical resistance is particularly useful in the fabrication of the nitride components, particularly using selective chemical etching techniques.

Nitrided porous silicon, which remains porous, provides a porous medium of much more chemically stable composition, extending the application of porous silicon to cases where the ambient contains oxygen and at higher temperatures. The same is true for silicon carbide. One example is the use of porous silicon as a limited diffusion barrier to ions, as in a miniature reference electrode. Another application is as a gas diffusion barrier in gas sensors operated in the diffusion limited regime. One such device is the ZrO (zirconium oxide) electrolytic cell for oxygen concentration determination. Automotive sensors for $O_2$ are primarily of this type, and must operate at very high temperatures, greater than 700° C. Porous nitride, or carbide, can be used as a diffusion limiting membrane in a microsensor version of this sensor.

Similarly, the chemically stabilized porous silicon, either the silicon nitride or silicon carbide, can be used in a humidity sensor, where the porous structure would contain a hydroscopic material, such as lithium chloride, whose conductivity changes with humidity. Since the porous support must be insulating, relatively inert, provide a large surface area and a means of containment of the salt, as well as be somewhat stable in high humidity environments, or at least give a reversible response to humidity, porous silicon cannot be used since it is not insulating, inert, and oxidizes in response to vapor and/or oxygen.

In summary, the stoichiometric silicon nitride and silicon carbide formed by addition reaction of a gas with porous silicon in thicknesses greater than one micron, have advantages over silicon nitride and silicon carbide formed by other processes, including low residual stress, greater flexibility of morphology and integration with other processing technologies such as CVD and displacement reaction, and fabrication technologies such as chemical etching, and are therefore useful for a number of applications in the fabrication of microsensors, x-ray masks, and ion diffusion barrier electrodes.

Modifications and variations of the method and products of the present invention will be obvious to those skilled in the art from the foregoing detailed description of the invention. Such modifications and variations are intended to come within the scope of the appended claims.

We claim:

1. A method for fabricating low residual stress insulating films in a silicon substrate comprising the steps of:
   a) forming a porous silicon layer in a silicon layer or silicon substrate, b) nitriding the porous silicon layer in a non-oxidizing ambient of nitrogen, ammonia, a nitrogen-containing chemical, or combinations thereof, at a temperature less than 1000° C., c) continuing step (b) for a time sufficient to convert the porous silicon layer to a silicon nitride layer with a thickness greater than one micron.

2. The method of claim 1, wherein the silicon layer or silicon substrate is doped with As, B, or P prior to step (a).

3. The method of claim 1, wherein the porous silicon layer is nitrided for a time sufficient to convert the porous silicon layer to a non-stoichiometric silicon nitride layer.

4. The method of claim 1, wherein the porous silicon layer is nitrided for a time sufficient to convert the porous silicon layer to a stoichiometric silicon nitride layer.

5. The method of claim 1, wherein the resulting silicon nitride layer is porous.

6. The method of claim 5, wherein step (c) is continued for a time sufficient only to cover the interior surface of the pores in the porous silicon layer.

7. The method of claim 5, further comprising depositing a material selected from the group consisting of silicon, silicon-rich nitride, silicon oxide, silicon dioxide, aluminum oxide, titanium silicide, tungsten silicide, copper, aluminum, gold, silver, diamond, and combinations thereof, in the porous silicon nitride layer.

8. The method of claim 1, further comprising: continuing to deposit the material so as to both completely fill the pores and deposit the material on the silicon nitride layer.

9. The method of claim 1, further comprising depositing a material selected from the group consisting of silicon, silicon-rich nitride, silicon oxide, silicon dioxide, aluminum oxide, titanium silicide, tungsten silicide, copper, aluminum, gold, silver, diamond, and combinations thereof, on top of the silicon nitride layer.

* * * * *